United States Patent [19]
Mori

[11] Patent Number: 5,801,584
[45] Date of Patent: Sep. 1, 1998

[54] CONSTANT-CURRENT CIRCUIT USING FIELD-EFFECT TRANSISTOR

[75] Inventor: Kazuyuki Mori, Kawasaki, Japan

[73] Assignee: Fujitsu Limited, Kanagawa, Japan

[21] Appl. No.: 630,881

[22] Filed: Apr. 2, 1996

Related U.S. Application Data

[62] Division of Ser. No. 374,047, Jan. 18, 1995, abandoned.

[30] Foreign Application Priority Data

Feb. 10, 1994 [JP] Japan ..................... 6-016200

[51] Int. Cl.$^6$ ..................................... H03K 3/02
[52] U.S. Cl. .................. 327/543; 327/513; 327/538; 327/546
[58] Field of Search .................. 327/403, 404, 327/513, 538, 539, 543, 545, 546

[56] References Cited

U.S. PATENT DOCUMENTS

| | | | |
|---|---|---|---|
| 4,399,374 | 8/1983 | Boeke | 327/538 |
| 4,532,443 | 7/1985 | Glennon | 327/404 |
| 4,945,259 | 7/1990 | Anderson | 327/538 |
| 5,138,479 | 8/1992 | Behagel et al. | 327/404 |
| 5,247,209 | 9/1993 | Cheng | 327/538 |
| 5,440,277 | 8/1995 | Ewen et al. | 327/538 |
| 5,552,744 | 9/1996 | Burlison et al. | 327/403 |

OTHER PUBLICATIONS

IBM Technical Disclosure Bulletin—"Wide–Temperature–Range Current–Source Generator", Apr. 1987, pp. 5096–5097.

Primary Examiner—Terry Cunningham
Attorney, Agent, or Firm—Helfgoot & Karas, P.C.

[57] ABSTRACT

The gate terminal of a FET is supplied with a bias voltage from a gate biasing circuit and a fluctuation in voltage $V_{CS}$ applied to a constant-current circuit is detected by a voltage-fluctuation detector. A gate-bias controller controls the gate biasing circuit to lower the gate bias voltage in a case where the fluctuation in voltage $V_{CS}$ has changed in an increasing direction, and to raise the gate bias voltage in a case where the fluctuation in voltage $V_{CS}$ has changed in the decreasing direction. Further, there are provided a plurality of constant-current sources having respective FETs and biasing circuits for setting a prescribed power-supply voltage characteristic and a prescribed temperature characteristic. A constant-current circuit is constructed by parallel-connecting the FETs in the plurality of constant-current sources through the drains and sources thereof.

3 Claims, 15 Drawing Sheets

CONSTANT-CURRENT CIRCUIT USING FIELD-EFFECT TRANSISTOR

This is a division, of application Ser. No. 08/374,047, filed Jan. 18, 1995 now abandoned.

BACKGROUND OF THE INVENTION

This invention relates to a constant-current circuit which uses a field-effect transistor (FET). More particularly, the invention relates to a constant-current circuit using a FET in which the value of current can be held constant even if a voltage applied to a constant-current source fluctuates, as well as a constant-current circuit using a FET in which a current ip characteristic with regard to temperature and a fluctuation in power-supply voltage can be made a desired characteristic.

Various constant-current circuits using a field-effect transistor (hereinafter referred to as a "FET") have been proposed. FIGS. 14 and 15 are diagrams of conventional constant-current circuits using a FET. In the constant-current circuit of FIG. 14, a resistor 12 is connected to a source terminal S of a FET 11, and a bias voltage $V_{SS}$ is connected to a gate terminal G of the FET 11. It is so arranged that a load circuit such as a differential amplifier is connected to a drain terminal D of the FET 11. In the constant-current circuit of FIG. 15, the circuit has a gate biasing section 15 for voltage-dividing the power-supply voltage by resistors 13, 14 and applying the divided voltage to the gate terminal G of the FET 11. It is so arranged that a load circuit such as a differential amplifier is connected to a drain terminal D of the FET 11.

In such conventional constant-current circuits using a FET, drain current $I_d$ fluctuates when voltage $V_{CS}$ applied to the constant-current source fluctuates, as illustrated in FIG. 16. When the current value varies owing to the fluctuation in voltage, various problems arise depending upon the load circuit. For example, in an arrangement wherein a differential amplifier is connected to the drain terminal D as the load circuit, the following problem arises:

FIG. 17 is a diagram illustrating the construction of a differential amplifier using the constant-current circuit, shown in FIG. 14, as the constant-current source. The amplifier includes a constant-current circuit 10 and a differential circuit 16 composed of FETs 16a, 16b. A data signal enters the gate terminal of the FET 16a from an input terminal IN1, and a reference voltage (fixed voltage) enters the gate terminal of the FET 16b from an input terminal IN2. The source terminals of the FETs 16a, 16b are connected to the drain D of the FET 11 of constant-current circuit 10, the drain terminals of the FETs 16a, 16b are connected to ground (ground level) via load resistors 16c, 16d, respectively, and to respective output terminals OUT1, OUT2, from which differential signals having mutually different polarities are delivered as outputs. A GaAs MES-FET is an example of the FETs used.

If the data signal is larger than the reference voltage, the FET 16a turns on, the FET 16b turns off, the output terminal OUT1 delivers a low-level signal and the output terminal OUT2 delivers a high-level signal. If the data signal is smaller than the reference voltage, the FET 16a turns off, the FET 16b turns on, the output terminal OUT1 delivers a high-level signal and the output terminal OUT2 delivers a low-level signal.

When a data signal having a large amplitude, such as a 1 V peak-to-peak data signal, enters such a differential amplifier from the input terminal IN1, the output levels when the output terminals OUT1, OUT2 are at the low level differ. In addition, a phenomenon occurs in which waveform distortion and jitter increase. The reason for this is that the potential at point A in FIG. 17 is changed by being pulled toward the potential of the data signal. More specifically, when the amplitude of the data signal is large, the potential at point A is changed by being pulled toward the potential of the data signal by a short-channel effect in the FETs. If the potential at point A changes, the voltage $V_{CS}$ applied to the constant-current source varies and the current value changes, as shown in FIG. 16. As a consequence, the output levels of the output terminals OUT1, OUT2 differ and there is an increase in waveform distortion and jitter.

By way of example, if the level of the data signal is lower than the reference voltage, the potential at point A falls and the voltage $V_{CS}$ decreases. As a result, the value of the current which flows through the FET 16b becomes smaller than the original normal value, the voltage drop across the load resistor 16d declines and the low level becomes higher than the original low-level value. On the other hand, if the level of the data signal is higher than the reference voltage, the potential at point A rises and the voltage $V_{CS}$ increases. As a result, the value of the current which flows through the FET 16a becomes larger than the original normal value, the voltage drop across the load resistor 16c becomes larger and the low level becomes lower than the original low-level value. Consequently, the levels of the cross points of the differential outputs change and a shift in the phase direction occurs.

FIG. 18 shows a waveform response characteristic simulated by a simulator tool SPICE (simulation program with integrated circuit emphasis, developed by Berkeley University) for designing analog circuits. This is for a case in which a data sequence "101010. . ." having a 1 V peak-to-peak amplitude has been entered as the data signal. As will be obvious from FIG. 18, the differential output levels of the output terminals OUT1, OUT2 differ and the levels of cross points $X_1$, $X_2$ between the differential outputs vary so that there is a shift (jitter) in the phase direction. The foregoing is a first problem of the conventional constant-current circuit which uses a FET.

There are cases in which, depending upon the load circuit, there is need for a constant-current circuit having a desired temperature characteristic (temperature-current characteristic) and a desired power-supply voltage characteristic (power-supply voltage-current characteristic). For example, there are cases in which a laser diode is driven in such a manner that optical power is rendered constant. In order to obtain constant optical power from a laser diode, the quantity of light outputted by the laser diode should be detected and feedback control should be applied in such a manner that the detected quantity of light is rendered constant. Recently, however, it is required that optical power be made constant without feedback control in order to lower cost.

FIG. 19 is a diagram showing a laser-diode drive circuit, in which numeral 10 denotes a constant-current circuit. The latter is so constructed that a diode 17 having a negative characteristic with respect to temperature is inserted in the source of the FET 11 of the constant-current circuit shown in FIG. 15. Numeral 18 denotes a differential circuit, composed of FETs 18a, 18b, in which a laser diode 18d is the load. Numeral 18c denotes a diode.

The relationship between the optical power of the laser diode 18d and the value of current is as illustrated in FIG. 20. The characteristic of optical power vs. current varies depending upon temperature. This means that in order to generate a constant optical power $P_O$ irrespective of temperature, it is required that the current value I of the constant-current circuit 10 be made $Ib_1$ in case of low temperature, $Ib_2$ in case of ordinary temperature and $Ib_3$ in case of high temperature, owing to the variation in temperature.

Accordingly, the diode 17 having the negative characteristic with respect to temperature is inserted in the source of the FET 11 of the constant-current circuit 10. A negative characteristic with respect to temperature is a characteristic in which the voltage drop across the diode becomes small at high temperature and large at low temperature. When a high temperature is reached, therefore, the voltage drop across the diode 17 decreases, the voltage $V_{gs}$ across the gate and source of the FET 11 grows larger and the current increases to the value $Ib_3$. Conversely, when the temperature becomes low, the voltage drop across the diode 17 increases, the voltage $V_{gs}$ across the gate and source of the FET 11 diminishes and the current decreases to the value $Ib_1$. The value of the current is $Ib_2$ at ordinary temperature. More specifically, the temperature-current characteristic of the constant-current circuit 10 is a characteristic indicated by the dashed line in FIG. 21A. In accordance with such a constant-current circuit 10, when the FET 18b is turned on by the data signal which enters from the input terminal IN1, the value of current which flows through the laser diode 18d varies, as shown in FIG. 21A, owing to temperature. As a result, a constant optical power $P_O$ is obtained irrespective of temperature.

However, with the construction of the constant-current circuit 10 in the laser-diode drive circuit of FIG. 19, a fluctuation in power-supply voltage is accompanied by a change in current value, as a result of which the optical power fluctuates. For example, when the absolute value of the power-supply voltage $V_{SS}$ (negative polarity) increases, the gate-source voltage $V_{gs}$ of the FET 11 becomes larger and the value of current increases. When the absolute value of the power-supply voltage $V_{SS}$ (negative polarity) decreases, on the other hand, the gate-source voltage $V_{gs}$ of the FET 11 becomes smaller and the value of current decreases. In other words, the power-supply voltage-current characteristic of the constant-current circuit 10 is a characteristic indicated by the dashed line in FIG. 21B. When the current value thus fluctuates owing to a fluctuation in the power-supply voltage, the optical power of the laser diode also fluctuates and a constant optical power $P_O$ is not obtained. This is a second problem encountered in the conventional constant-current circuit using a FET.

Thus, the laser-diode drive circuit requires a characteristic indicated by the solid line in FIG. 21 to deal with temperature fluctuations and a characteristic indicated by the solid line in FIG. 21B to deal with fluctuations in power-supply voltage (a characteristic in which current value is constant with respect to a variation in power-supply voltage).

Thus, as set forth above, two problems arise in the conventional constant-current circuits which rely upon FETS. First, current varies when the voltage $V_{CS}$ applied to the constant-current source fluctuates. Second, the temperature-current characteristic and the power-supply voltage-current characteristic cannot both be made the desired characteristics in a simple manner.

SUMMARY OF THE INVENTION

Accordingly, a first object of the present invention is to provide a constant-current circuit in which current can be rendered constant through a simple arrangement even if the voltage $V_{CS}$ applied to the constant-current source fluctuates.

Another object of the present invention is to provide a constant-current circuit in which tie temperature-current characteristic and the power-supply voltage-current characteristic can both be made desired characteristics in a simple manner.

According to the present invention, the first object is attained by providing a constant-current circuit comprising a field-effect transistor, a gate biasing circuit for supplying a bias voltage to a gate terminal of the field-effect transistor, a voltage-fluctuation detector for detecting a fluctuation in voltage applied to the constant-current circuit (FET), and a gate-bias controller for controlling gate bias voltage in such a manner that gate bias voltage falls if the fluctuation in voltage has changed in an increasing direction and rises if the fluctuation in voltage has changed in a decreasing direction.

According to the present invention, the second object is attained by providing a constant-current circuit comprising a plurality of constant-current sources each having a field-effect transistor and a biasing circuit for setting a prescribed power-supply voltage characteristic and a prescribed temperature characteristic, and an arrangement for parallel-connecting the field-effect transistors in the plurality of constant-current sources by interconnecting drains and interconnecting sources of the field-effect transistors.

By way of example, according to the present invention, the second object is attained by providing a constant-current circuit comprising a first constant current source having a biasing circuit for setting a power-supply voltage characteristic in which drain current increases in dependence upon an increase in power-supply voltage and a temperature characteristic in which drain current increases in dependence upon an increase in temperature, a second constant-current source having a biasing circuit for setting a power-supply voltage characteristic in which drain current decreases in dependence upon an increase in power-supply voltage and a temperature characteristic in which drain current is rendered substantially constant even if temperature fluctuates, and an arrangement for parallel-connecting the first and second constant-current sources by interconnecting drains and interconnecting sources of the constant-current sources, the constant-current circuit having a power-supply voltage characteristic in which drain current is rendered substantially constant even if power-supply voltage fluctuates, and a temperature characteristic in which drain current increases in dependence upon an increase in temperature.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS (A) Overview of the invention

Figure 1A:
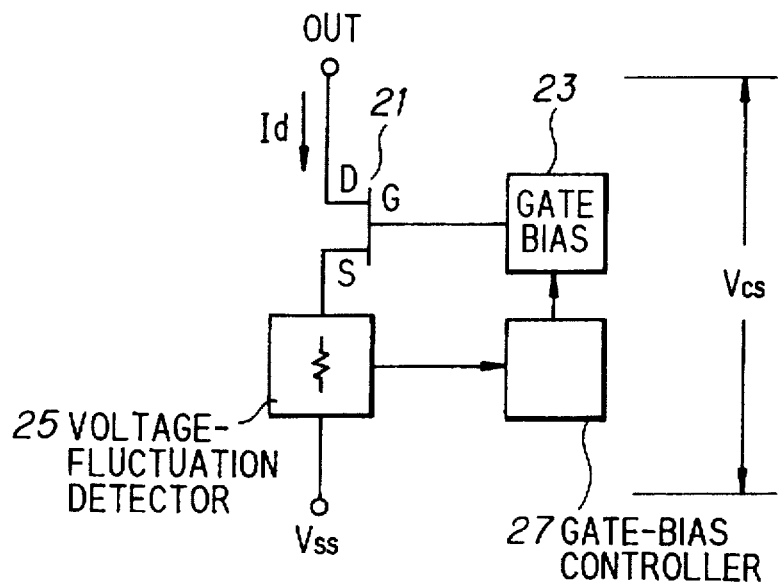
FIG. 1A is a diagram for describing a first aspect of the present invention.

FIG. 1A is a diagram for describing a first aspect of the present invention.

Shown in FIG. 1A are a field-effect transistor (FET) 21, a gate biasing circuit 23 for supplying the gate terminal of the FET 21 with a bias voltage, a voltage-fluctuation detector 25 for detecting a fluctuation in voltage applied to the constant-current circuit (FET), and a gate-bias controller 27 for controlling the gate bias voltage in such a manner that gate bias voltage is lowered if the fluctuation in voltage has changed in an increasing direction and is raised if the fluctuation in voltage has changed in a decreasing direction.

The gate terminal of the FET 21 is supplied with the bias voltage from the gate biasing circuit 23, and a fluctuation in voltage $V_{CS}$ applied to the constant-current circuit is detected by the voltage-fluctuation detector 25. The gate-bias controller 27 controls the gate biasing circuit 23 to lower the gate bias voltage in a case where the fluctuation in voltage $V_{CS}$ has changed in an increasing direction, and to raise the gate bias voltage in a case where the fluctuation in voltage $V_{CS}$ has changed in the decreasing direction. Thus, the fluctuation in the voltage $V_{CS}$ applied to the constant-current circuit is detected and feedback control is performed so as to decrease/increase the gate bias voltage of the FET in dependence upon an increase/decrease in the fluctuation of voltage. Even if the voltage $V_{CS}$ fluctuates, therefore, the current $I_d$ can be held constant.

Further, if the voltage-fluctuation detector 25 is connected to the source terminal of the FET 21, the gate-bias controller is constituted by a second FET, a resistor is parallel-connected between the gate and source of the second FET and the drain terminal of the second FET is connected to the gate terminal of the first FET 21, then the gate bias voltage of the first FET can be controlled based upon the terminal voltage of the resistor (the voltage $V_{CS}$ applied to the constant-current circuit) and current can be held constant, even if the voltage $V_{CS}$ fluctuates, through a simple arrangement.

Figure 1B:
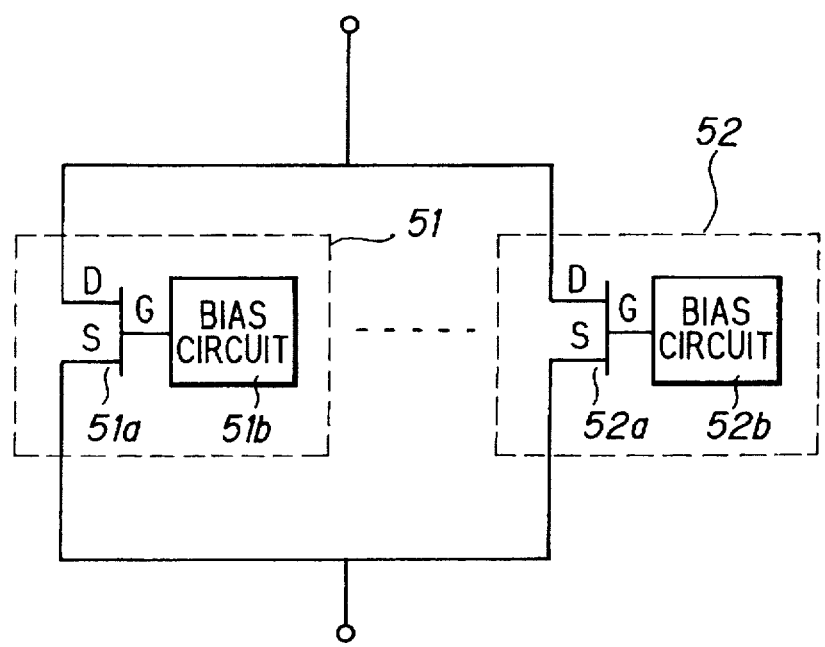
FIG. 1B is a diagram for describing a second aspect of the present invention.

FIG. 1B is a diagram for describing a second aspect of the present invention.

Shown in FIG. 1B are constant-current sources 51, 52, . . . , FETs 51a, 52a, . . . , and biasing circuits 51b, 52b, . . . for setting a prescribed power-supply voltage characteristic and a prescribed temperature characteristic for the respective FET.

Thus, there are provided a plurality of constant-current sources 51, 52 . . . having respective FETs 51a, 52a, . . . and biasing circuits 51b, 52b for setting the prescribed power-supply voltage characteristic and the prescribed temperature characteristic. A constant-current circuit is constructed by parallel-connecting the FETs in the plurality of constant-current sources through the drains and sources of the FETs. If this arrangement is adopted, the overall desired power-supply voltage characteristic and temperature characteristic are obtained by adjusting the power-supply voltage characteristic and temperature characteristic of each individual one of the constant-current sources 51, 52 . . . . For example, there are provided a first constant-current source 51 having a biasing circuit for setting a power-supply voltage characteristic in which drain current increases in dependence upon an increase in power-supply voltage and a temperature characteristic in which drain current increases in dependence upon an increase in temperature, and a second constant-current source 52 having a biasing circuit for setting a power-supply voltage. characteristic in which drain current decreases in dependence upon an increase in power-supply voltage and a temperature characteristic in which drain current is rendered substantially constant even if temperature fluctuates. By parallel-connecting the drains and sources of the first and second constant-current sources, a power-supply voltage characteristic in which drain current is rendered substantially constant even if power-supply voltage fluctuates and a temperature characteristic in which drain current increases in dependence upon an increase in temperature can be set. If this constant-current circuit is used as a constant-current source of a laser-diode drive circuit, the laser diode can be driven in such a manner that optical power is rendered constant.

(B) First embodiment of the invention (a) Construction

Figure 2:
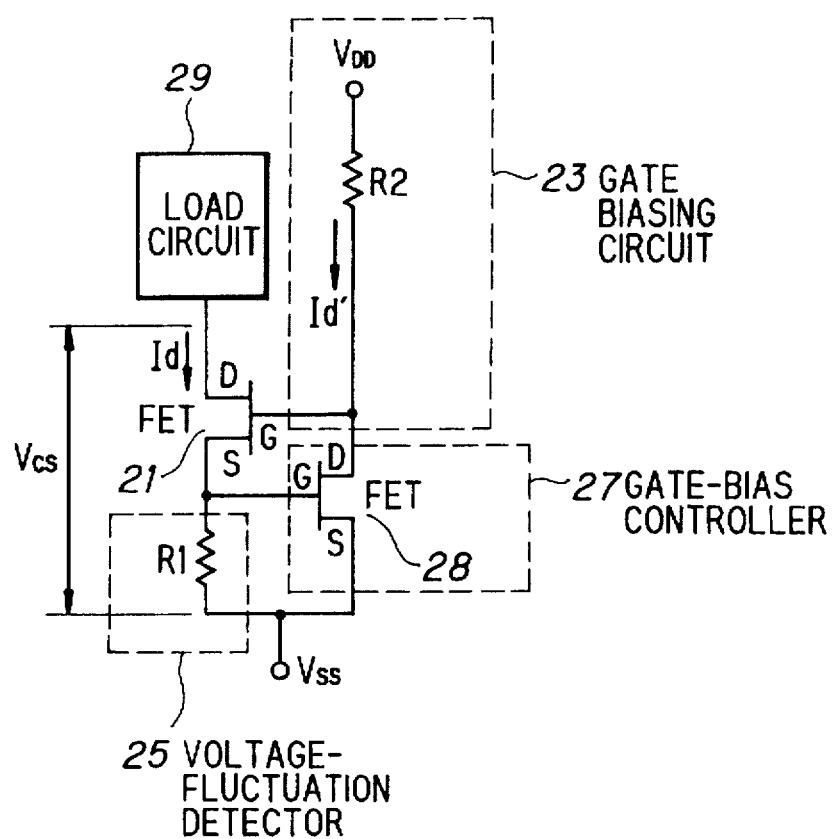
FIG. 2 is a diagram showing the construction of a constant-current circuit using FETs in a first embodiment of the present invention.

FIG. 2 is a diagram showing the construction of a constant-current circuit using FETs in a first embodiment of the present invention. Shown in FIG. 2 are the field-effect transistor (FET) 21 and the gate biasing circuit 23 for supplying the gate terminal of the FET 21 with a bias voltage. The arrangement is such that a bias voltage $V_{DD}$ (e.g., earth level) is connected to the gate terminal via a resistor R2. Further, the voltage-fluctuation detector 25 detects a fluctuation in voltage $V_{CS}$ applied to the constant-current circuit (FET). The detector 25 is constituted by a resistor R1 connected across the power supply (negative voltage) $V_{SS}$ and the source terminal of the FET 21. The gate-bias controller 27 controls the gate bias voltage in such a manner that gate bias voltage is lowered if the fluctuation in voltage $V_{CS}$ applied to the constant-current circuit has changed in an increasing direction and is raised if the fluctuation in voltage has changed in a decreasing direction. The gate-bias controller 27 is constituted by a second FET 28 having a gate and source across which the resistor R1 is connected in parallel. The drain terminal of the FET 28 is connected to the gate terminal of the first FET 21. A load circuit 29 of the constant-current circuit is connected to the drain terminal of the first FET 21. An example of the load circuit is a FET-based differential amplifier circuit.

(b) Operation

If the voltage $V_{CS}$ applied to the constant-current circuit changes, the drain current $I_d$ increases. When the drain current $I_d$ increases, the voltage drop across the resistor R1 grows larger, the gate-source voltage $V_{gs}$ of the second FET 28 increases, the current (drain current of the FET 28) which flows through the resistor R2 of the gate biasing circuit 23 increases, the voltage drop across the resistor R2 becomes larger and the gate voltage of the first FET 21 drops. As a result, the gate-source voltage $V_{gs}$ of the first FET 21 diminishes so that the drain current $I_d$ is reduced.

On the other hand, if the voltage $V_{CS}$ applied to the constant-current circuit varies in the decreasing direction, the drain current $I_d$ decreases. When the drain current $I_d$ decreases, the voltage drop across the resistor R1 becomes smaller, the gate-source voltage $V_{gs}$ of the second FET 28 decreases, a current $I_d'$ which flows through the resistor R2 of the gate biasing circuit 23 decreases, the voltage drop across the resistor R2 becomes smaller and the gate voltage of the first FET 21 rises. As a result, the gate-source voltage $V_{gs}$ of the first FET 21 increases so that the drain current $I_d$ is increased.

Thus, in accordance with the constant-current circuit of shown in FIG. 2, even if the voltage $V_{CS}$ fluctuates and the drain current $I_d$ varies, feedback is applied so as to render the current value constant. As a result, the value $I_d$ of drain current can be held constant irrespective of the voltage $V_{CS}$.

Figure 3:
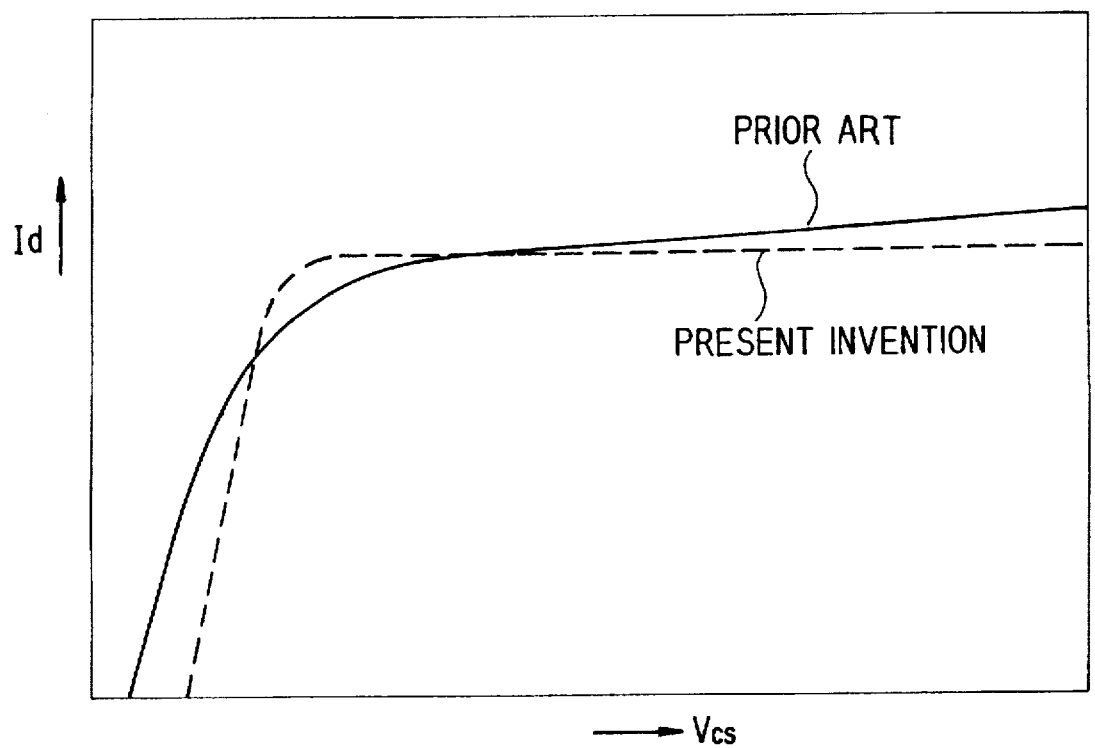
FIG. 3 is a characteristic of voltage $V_{CS}$ vs. current $I_d$.
Figure 15:
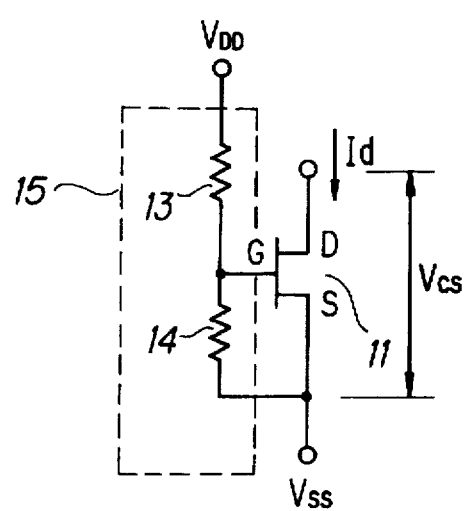
FIG. 15 is a diagram showing the construction of a second constant-current circuit using a FET according to the prior art.
Figure 16:
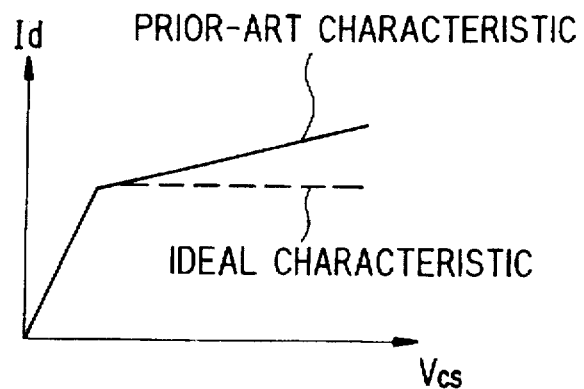
FIG. 16 is a characteristic diagram of voltage $V_{CS}$ versus drain current $I_d$ according to the prior art.
Figure 17:
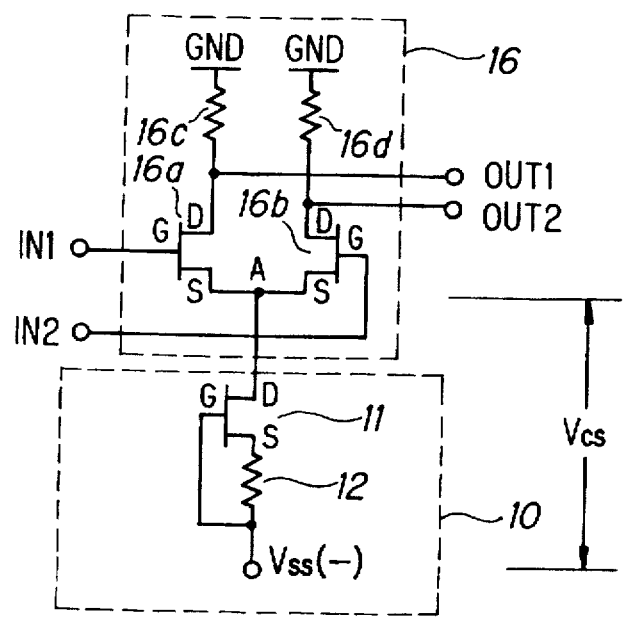
FIG. 17 is a diagram showing the construction of a differential amplifier using a constant-current circuit according to the prior art.
Figure 18:
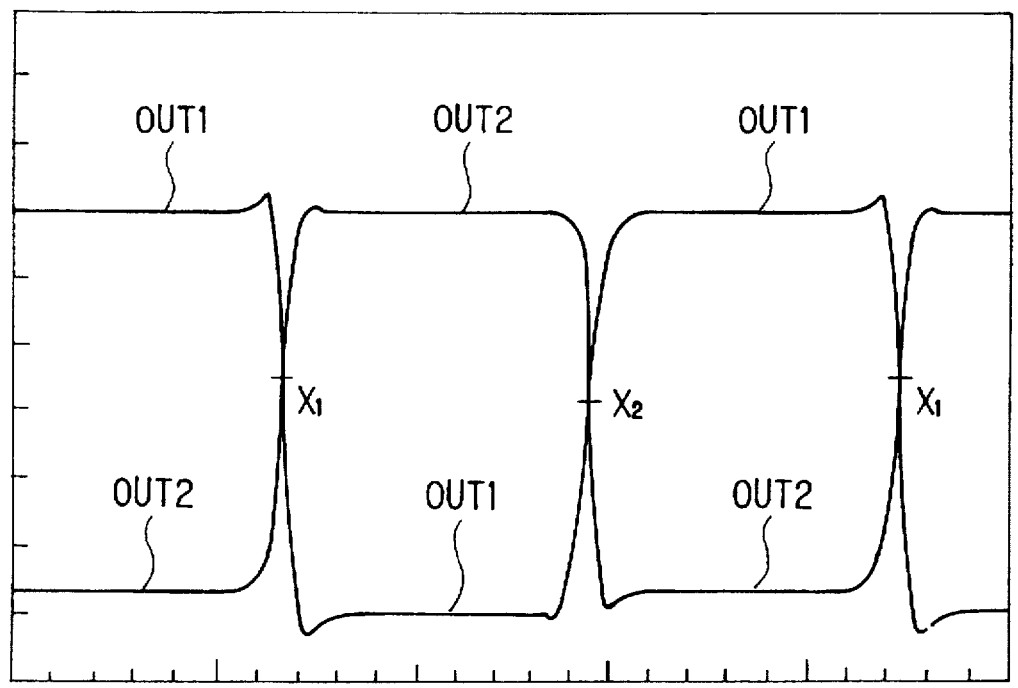
FIG. 18 is a waveform diagram showing differential outputs according to the prior art.
Figure 19:
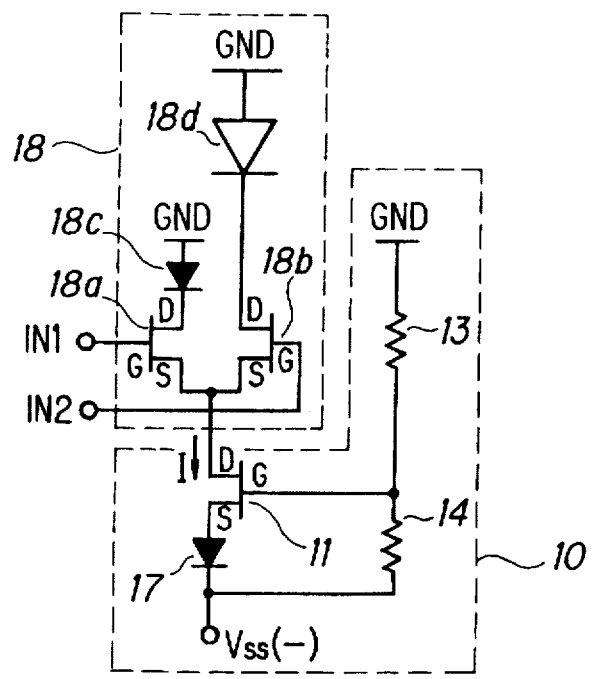
FIG. 19 is a diagram showing the construction of a laser-diode drive circuit according to the prior art.
Figure 20:
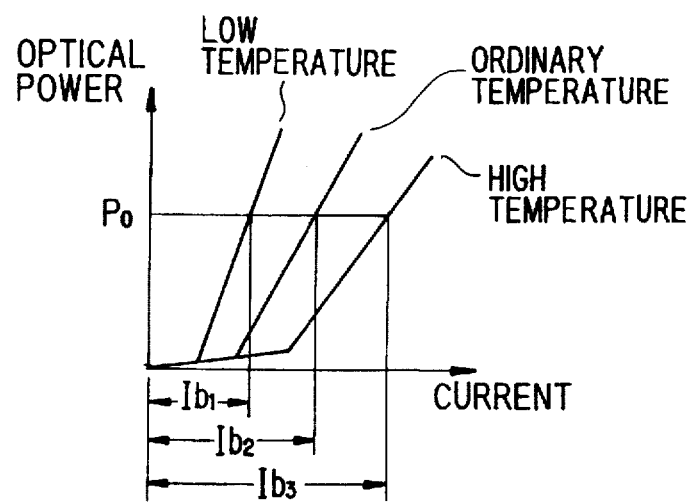
FIG. 20 is a characteristic diagram of optical power versus current in a laser diode.

FIG. 3 is a voltage-current characteristic diagram showing voltage-current characteristics according to the present invention and the prior art. The solid line is the characteristic according to the prior-art constant-current circuit (FIG. 15) and the dashed line is the characteristic of the constant-current circuit (exclusive of the load circuit) according to the invention shown in FIG. 2. It will be understood from FIG. 3 that the constant-current circuit of the present invention makes it possible to hold the value $I_d$ of drain current constant even when the voltage $V_{CS}$ fluctuates.

(c) Example of application

Figure 4:
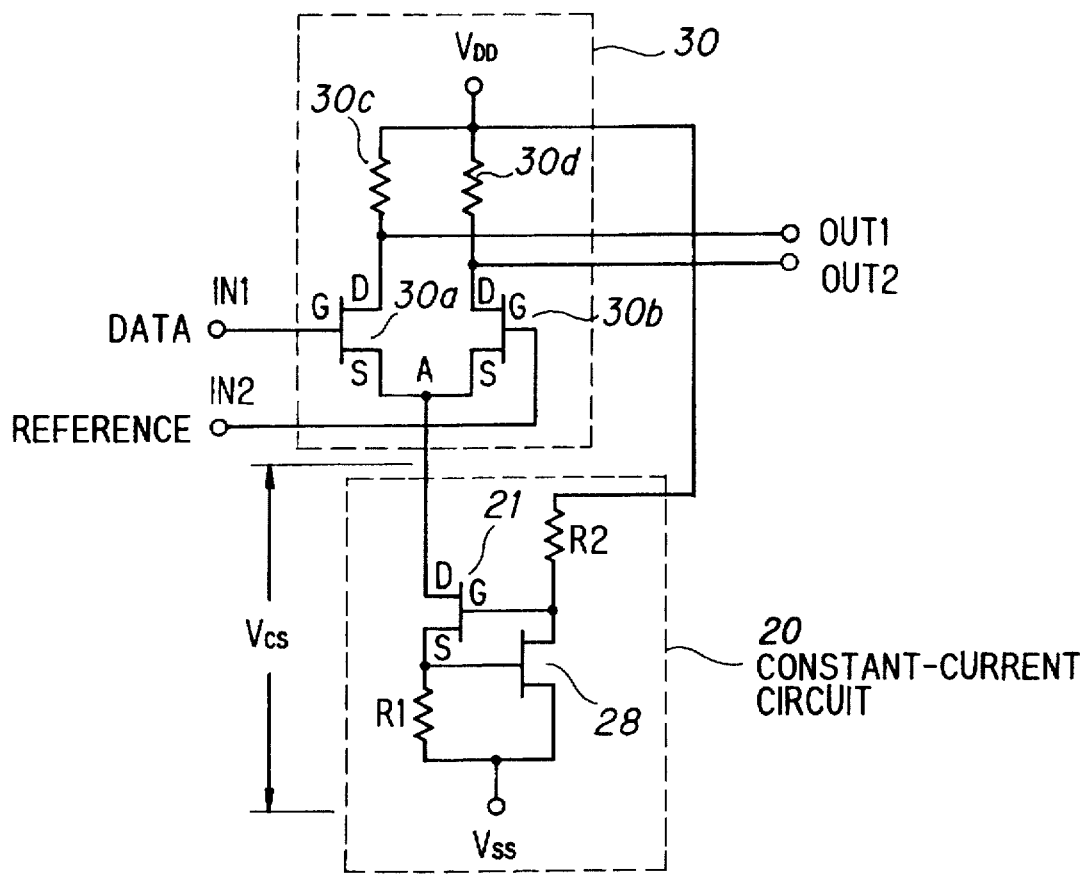
FIG. 4 shows an example of application of the constant-current circuit according to the present invention.

FIG. 4 shows an example of application in which the constant-current circuit of FIG. 2 is used as the constant-current source of a differential amplifier. Shown in FIG. 4 are a constant-current circuit 20, which is the constant-current circuit of FIG. 2, and a differential circuit 30 composed of FETs 30a, 30b. In the differential circuit 30, a data signal enters the gate terminal of the FET 30a from the input terminal IN1, and a reference voltage (a fixed voltage) enters the gate terminal of the FET 30b from the input terminal IN2. The source terminals of the FETs 30a, 30b are connected to the drain D of the FET 21 of constant-current circuit 20, the drain terminals of the FETs 30a, 30b are connected to a bias power supply (ground level) via respective load resistors 30c, 30d, as well as to output terminals OUT1, OUT2, from which signals having mutually different polarities are delivered as outputs. A GaAs MESFET is an example of the FETs used.

If the data signal is larger than the reference voltage, the FET 30a turns on, the FET 30b turns off, the output terminal OUT1 delivers a low-level signal and the output terminal OUT2 delivers a high-level signal. If the data signal is smaller than the reference voltage, the FET 16a turns off, the FET 30b turns on, the output terminal OUT1 delivers a high-level signal and the output terminal OUT2 delivers a low-level signal.

In accordance with this differential amplifier, when a data signal having a large amplitude, such as a 1 V peak-to-peak data signal, enters from the input terminal IN, the output levels of the output terminals OUT1, OUT2 at the time of the low level are identical, even if the potential at point A fluctuates owing to the short-channel effect. The phenomenon in which jitter increases does not occur. More specifically, when the amplitude of the data signal is large, the potential at point A is changed by being pulled toward the potential of the data signal owing to the short-channel effect in the FETs. However, since the value of drain current is rendered constant in the constant-current circuit 20 even when the $V_{CS}$ varies, the output levels of the output terminals OUT1, OUT2 do not change and jitter does not occur.

Figure 5:
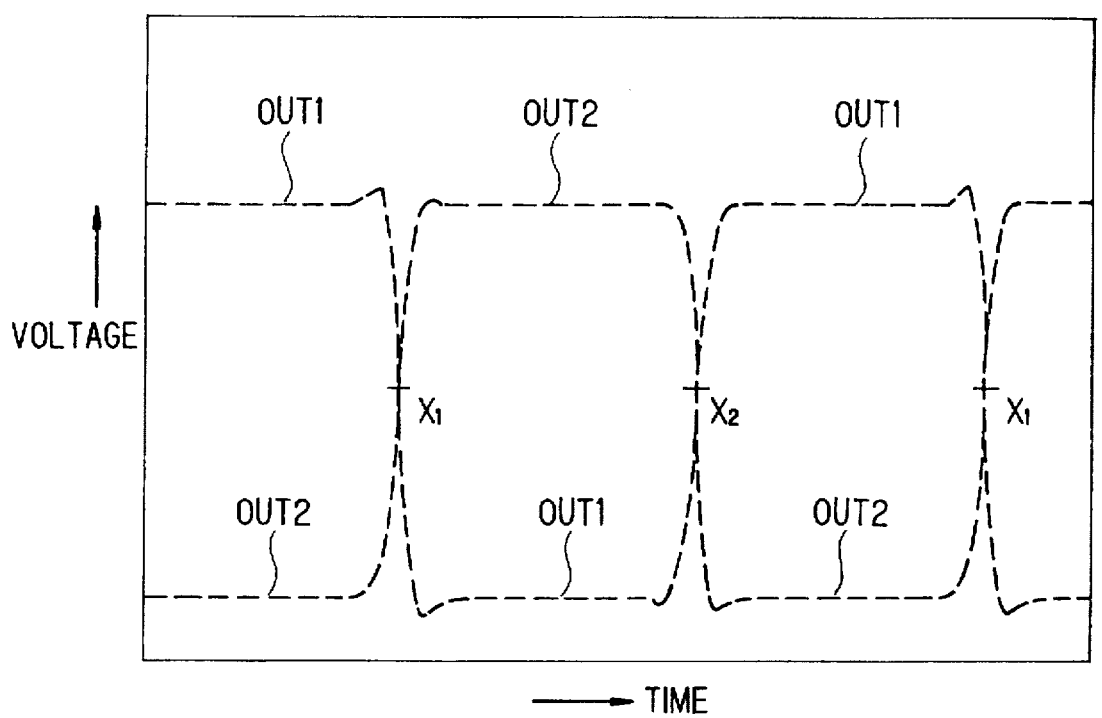
FIG. 5 is a waveform diagram illustrating differential outputs according to the present invention.

FIG. 5 shows a waveform response characteristic simulated by the simulator tool SPICE for designing analog circuits. This is for a case in which a data sequence "101010. . . " having a 1 V peak-to-peak amplitude has been entered as the data signal. As will be obvious from FIG. 5, the differential output levels at the output terminals OUT1, OUT2 are identical and the levels of cross points $X_1$, $X_2$ between the differential outputs vary so that there is a shift (jitter) in the phase direction.

(C) Second embodiment of the invention (a) Background

Figure 21A:
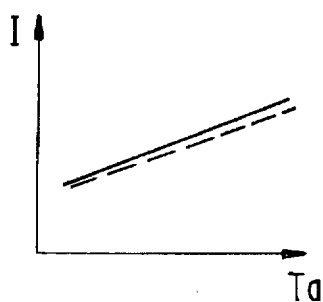
FIGS. 21A and 21B are diagrams for describing a characteristic (solid line), which is required for a constant-current circuit in a laser-diode drive circuit, and an actual characteristic (dashed line), respectively.
Figure 21B:
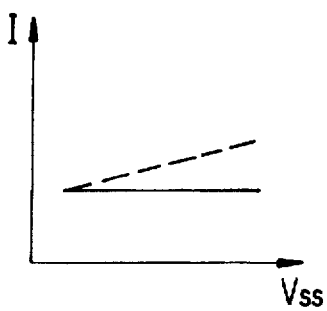

There are cases in which there is need for a constant-current circuit having a desired temperature characteristic (temperature-current characteristic) and a desired power-supply voltage characteristic (power-supply voltage-current characteristic). For example, in a laser-diode drive circuit, the characteristic indicated by the solid line in FIG. 21A is required to deal with a fluctuation in temperature, and the characteristic (in which current value is constant with respect to a fluctuation in power-supply voltage) indicated by the solid line in FIG. 21B is required to deal with a fluctuation in power-supply voltage. It is difficult to satisfy both requirements, i.e., to obtain both this temperature characteristic and this power-supply voltage characteristic, with a single constant-current source.

Accordingly, in the second embodiment of the present invention, there are provided a plurality of FET-based constant-current sources each having the prescribed power-supply voltage characteristic and the prescribed temperature characteristic, and these constant-current sources are connected in parallel to construct a constant-current circuit. If this arrangement is adopted, the overall desired power-supply voltage characteristic and temperature characteristic are obtained by adjusting the power-supply voltage characteristic and temperature characteristic of each individual one of the constant-current sources.

(b) Construction

Figure 6:
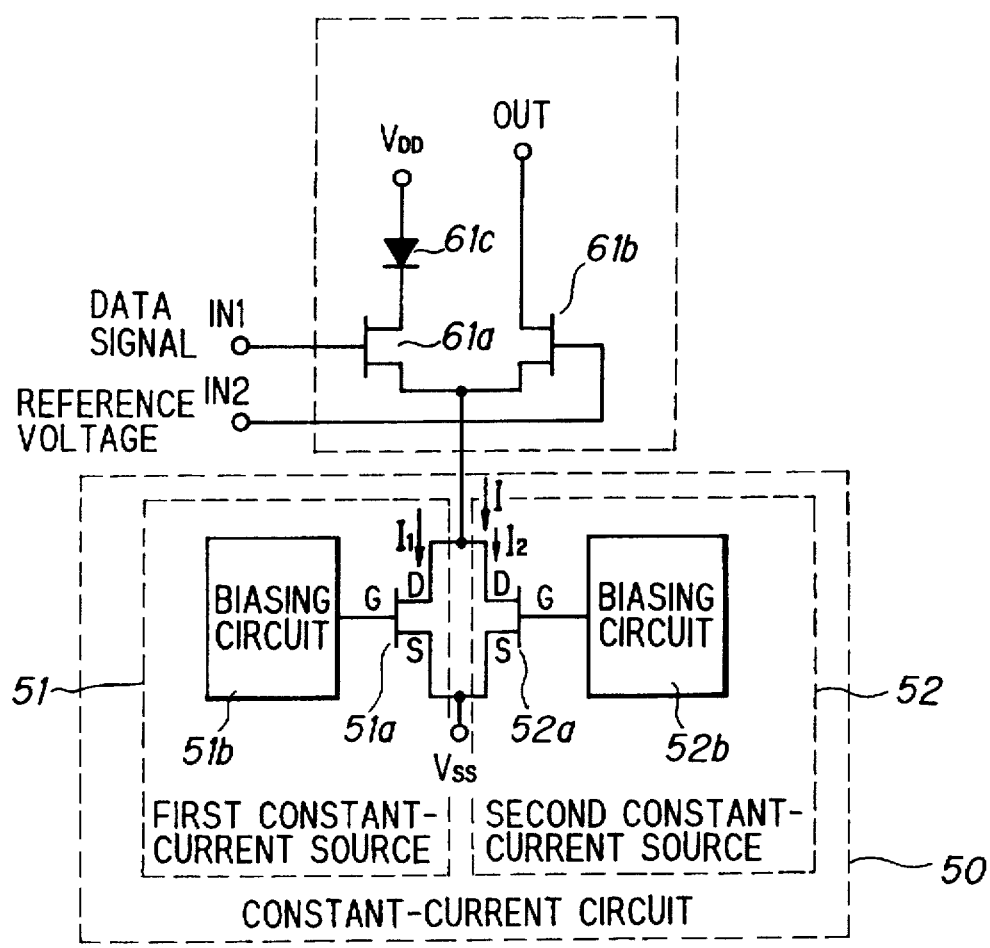
FIG. 6 is a diagram showing the construction of a constant-current circuit according to a second embodiment of the present invention.

FIG. 6 is a diagram showing the construction of a constant-current circuit according to a second embodiment of the present invention. Shown in FIG. 6 are a constant-current circuit 50, first and second constant-current sources 51, 52, FETs 51a, 52a and biasing circuits 51b, 52b each of which is for setting a prescribed power-supply voltage characteristic and a prescribed temperature characteristic.

Figure 7A:
FIGS. 7A and 7B are characteristic diagrams of a first constant-current source.
Figure 7B:
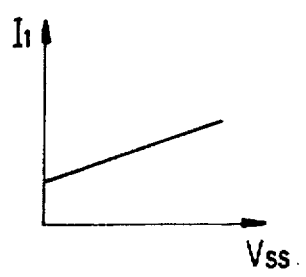

The first constant-current biasing circuit 51b sets a temperature characteristic and a power-supply voltage characteristic shown in FIGS. 7A and 7B, respectively. Specifically, the biasing circuit 51b sets a temperature characteristic in which drain current $I_1$ increases in conformity with an increase in temperature $T_a$, as well as a power-supply voltage characteristic in which drain current $I_1$ increases in conformity with an increase in power-supply voltage $V_{SS}$. The biasing circuit 52b of the second constant-current source sets a temperature characteristic and a power-supply voltage characteristic shown, by way of example, in FIGS. 8A and 8B, respectively. Specifically, the biasing circuit 52b sets a temperature characteristic in which drain current $I_1$ is rendered substantially constant even if temperature $T_a$ fluctuates, as well as a power-supply voltage characteristic in which drain current $I_1$ decreases in conformity with an increase in power-supply voltage $V_{SS}$.

Numeral 61 denotes a load circuit. By way of example, this may be a differential circuit constructed by differentially interconnecting FETs 61a, 61b. In the differential circuit 61, a data signal enters the gate terminal of the FET 61a from the input terminal IN1, and a reference voltage (a fixed voltage) enters the gate terminal of the FET 61b from the input terminal IN2. The source terminals of the FETs 61a, 61b are connected to the drains D of the FETs 51a, 51b of constant-current circuits 51, 52, respectively, the drain terminal of the FET 61a is connected to the bias power supply (ground level) via a diode 61c, and the drain terminal of the FET 61b is connected to, say, a laser diode (not shown) via an output terminal OUT.

Figure 9A:
FIGS. 9A and 9B are characteristic diagrams of the constant-current circuit.
Figure 9B:
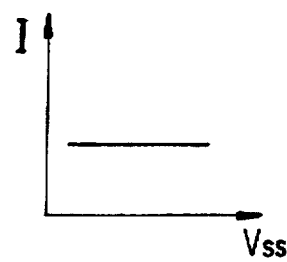

When the first and second constant-current sources 51, 52 are connected in parallel via their drains and sources to construct the constant-current circuit 50, the temperature characteristic of the constant-current circuit becomes the combined temperature characteristics of the first and second constant-current sources 51, 52. The result is a characteristic in which current I increases in conformity with an increase in the temperature $T_a$, as shown in FIG. 9A. Further, the power-supply voltage characteristic of the constant-current circuit becomes the combined power-supply voltage characteristic of the first and second constant-current sources 51, 52. The result is a characteristic in which current I is constant even when the power-supply voltage $V_{SS}$ increases, as shown in FIG. 9B. This temperature characteristic and power-supply voltage characteristic are characteristics required for the constant-current source of a laser-diode drive circuit.

It should be noted that a constant-current circuit having any characteristic, which is not limited to a temperature characteristic and power-supply voltage characteristic, can be constructed by connecting a plurality of constant-current sources in parallel and adjusting the characteristics of each individual constant-current source.

Figure 10:
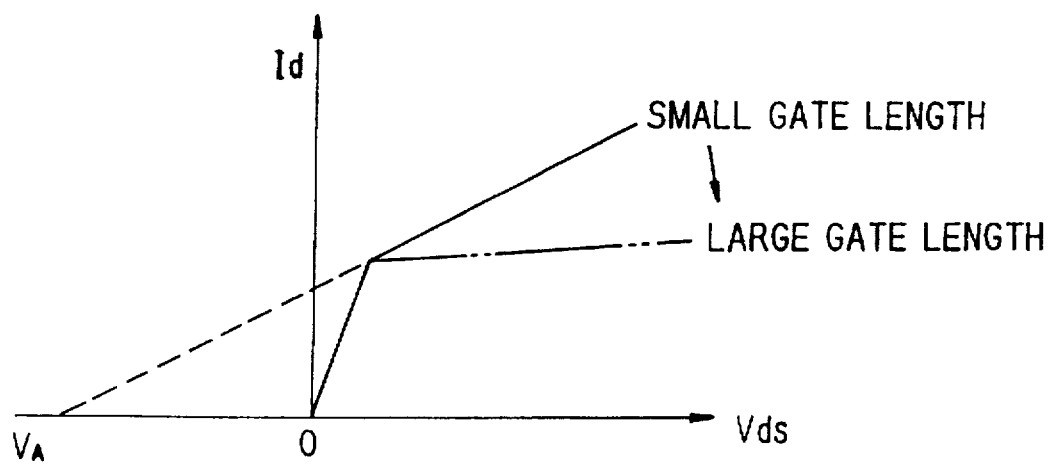
FIG. 10 is an $I_d$-$V_{ds}$ characteristic diagram of an FET.

The current levels of the constant-current sources can be brought into agreement by respective biasing circuits or by adjusting the gate lengths or gate widths of the respective FETs. That is, the drain current $I_d$ is given by the following equation:

$$I_d = K(V_{gs} - V_{th})^2 (1 + \lambda V_{ds})$$

and the $I_d$-$V_{ds}$ characteristic is as shown in FIG. 10, where the following holds:

$$K = (W_g/L_g) \beta$$

$W_g$: gate width
$L_g$: gate length
$\beta$: transconductance parameter
$V_{th}$: threshold value voltage
$V_{gs}$: gate-source voltage
$V_{ds}$: train-source voltage
$\lambda$: $1/V_A$
$V_A$: Early voltage Accordingly, the smaller the gate length $L_g$, the larger the drain current $I_d$; the larger the gate length $L_g$, the smaller the drain current $I_d$. As a result, it is possible to bring the current levels into agreement by adjusting the gate lengths of the respective FETs. Similarly, the currents can be brought into agreement by adjusting the gate width $W_g$.

(c) Laser-diode drive circuit (c-1) Construction

Figure 11:
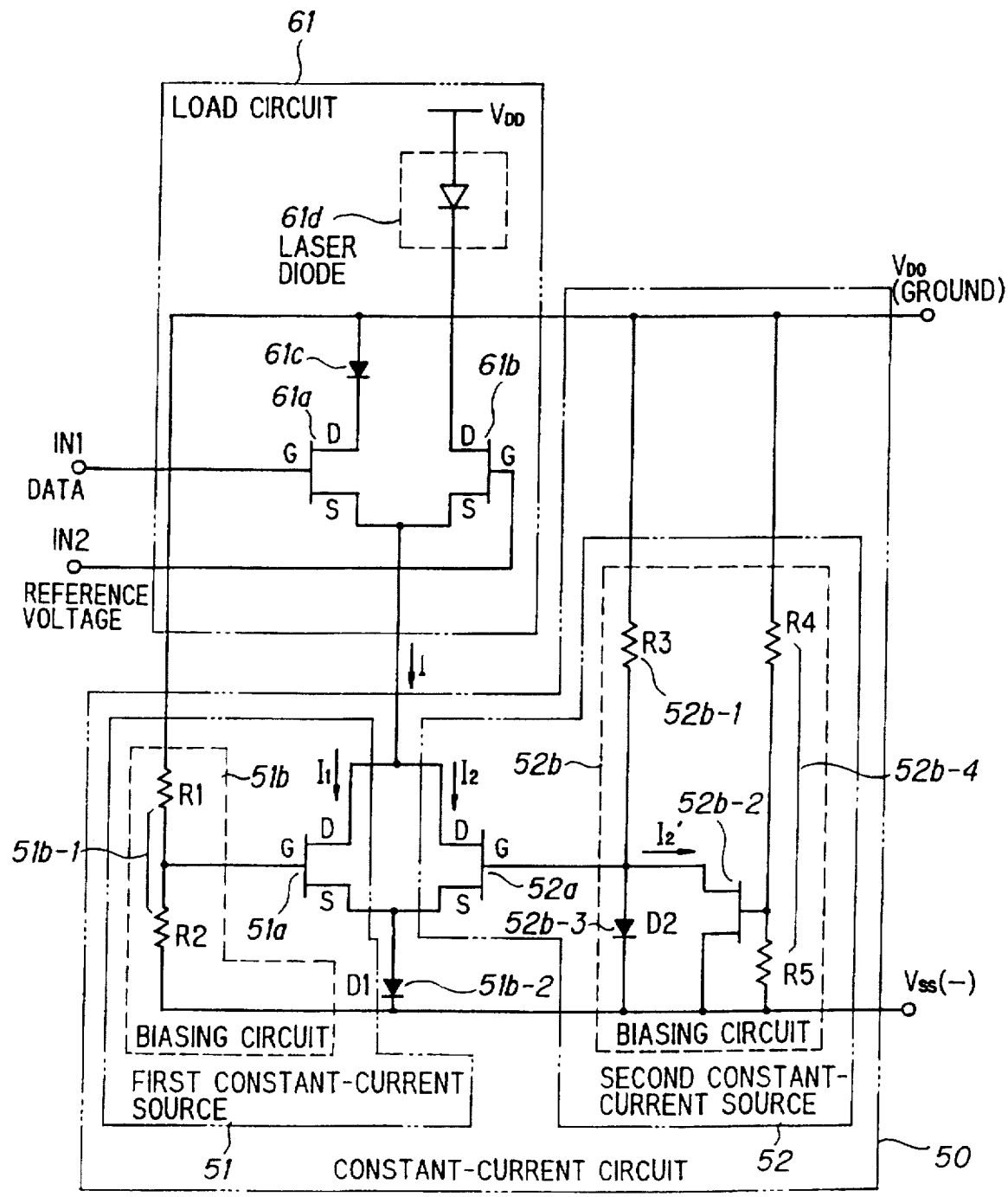
FIG. 11 is a diagram showing the construction of a laser-diode drive circuit.

FIG. 11 is a diagram showing the construction of a laser-diode drive circuit in which the constant-current circuit of the present invention is used as a constant-current source. Components identical with those shown in FIG. 6 are designated by like reference characters.

Shown in FIG. 11 are the constant-current circuit 50, the first and second constant-current sources 51, 52, the FETs 51a, 52a, a diode ($D_1$) 51b-2 and the biasing circuits 51b, 52b each of which is for setting a prescribed power-supply voltage characteristic and a prescribed temperature characteristic. The FETs 51a, 52a in the first and second constant-current sources 51, 52 are connected in parallel through their sources and drains so that the single constant-current circuit 50 is constructed overall.

Numeral 61 denotes the load circuit, which is constructed by differentially interconnecting the FETs 61a, 61b. In the differential circuit 61, a data signal enters the gate terminal of the FET 61a from the input terminal IN1, and a reference voltage (a fixed voltage) enters the gate terminal of the FET 61b from the input terminal IN2. The source terminals of the FETs 61a, 61b are connected to the drains D of the FETs 51a, 51b of constant-current circuits 51, 52, respectively, the drain terminal of the FET 61a is connected to the power supply (ground) $V_{DD}$ via the diode 61c, and the drain terminal of the FET 61b is connected to a laser diode 61d.

(c-2) Operation of biasing circuit in first constant-current source

The biasing circuit 51b of the first constant-current source sets the temperature characteristic and power-supply voltage characteristic shown in FIGS. 7A and 7B, respectively. The biasing circuit 51b has a resistor voltage-dividing section (resistors R1, R2) for voltage-dividing the power-supply voltage and applying the divided voltage to the gate terminal of the FET 51a. A diode ($D_1$) 51b-2, is connected between the source terminal of the FET 51a and the power supply $V_{SS}$ (negative polarity), and has negative characteristic with respect to a temperature rise.

Figure 12:
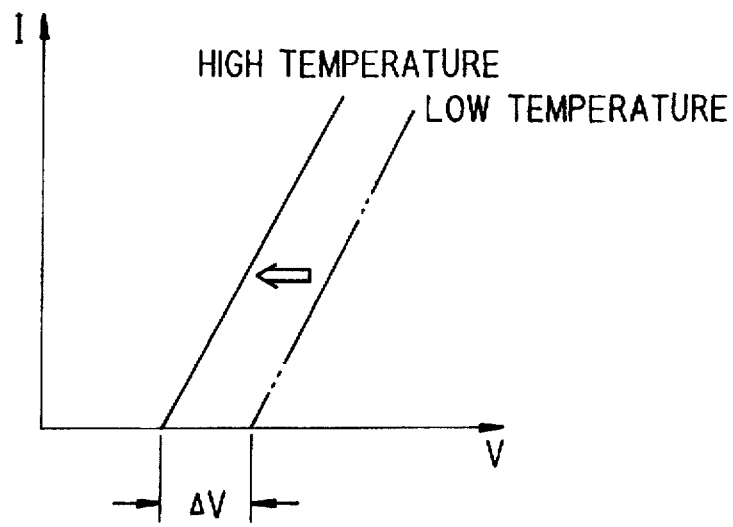
FIG. 12 is a current-voltage characteristic diagram regarding a fluctuation in diode temperature.

The diode D1 has a negative characteristic with respect to temperature, as shown in FIG. 12. When the temperature rises, therefore, the voltage drops, the gate-source voltage $V_{gs}$ of the FET 51a grows larger and the drain current $I_1$ increases. Conversely, when the temperature falls, the voltage drop increases, the gate-source voltage $V_{gs}$ of the FET 51a diminishes and the drain current $I_1$ decreases. As a result, the temperature characteristic shown in FIG. 7A can be set.

When the absolute value of the power-supply voltage $V_{SS}$ (negative polarity) increases, the gate-source voltage $V_{gs}$ of the FET 51a becomes larger and the current value increases. Conversely, when the absolute value of the power-supply voltage $V_{SS}$ (negative polarity) decreases, the gate-source voltage $V_{gs}$ of the FET 51a becomes smaller and the current value decreases. As a result, the temperature characteristic shown in FIG. 7B can be set.

Operation of biasing circuit in second constant-current source

Figure 8A:
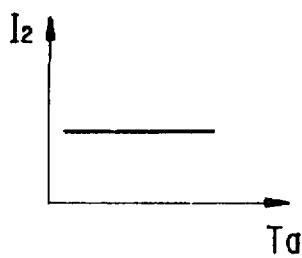
FIGS. 8A and 8B are characteristic diagrams of a second constant-current source.
Figure 8B:
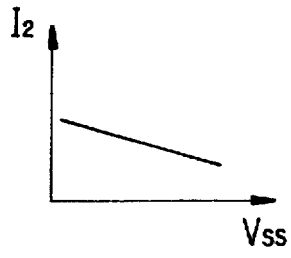

The biasing circuit 52b of the second constant-current source sets the temperature characteristic and power-supply voltage characteristic shown in FIGS. 8A and 8B, respectively. The biasing circuit 52b has a bias voltage supply section 52b-1 (resistor R3) for supplying the gate of the FET 52a with the bias voltage, a FET 52b-2 for controlling the bias voltage, a diode ($D_2$) 52b-3, which is connected between the gate terminal of the FET 52a and the power supply $V_{SS}$, having a negative characteristic with respect to a temperature rise, and a resistor voltage-dividing section (resistors R4, R5) for voltage-dividing the power-supply voltage and applying the divided voltage to the gate terminal of the FET 52b-2.

If the characteristics of the diodes $D_1$, $D_2$ with respect to temperature are made the same, the gate-source voltage $V_{gs}$ of the FET 52a does not change even if the temperature fluctuates. As a result, the drain current $I_2$ is rendered constant and the temperature characteristic shown in FIG. 8A can be set.

Figure 13:
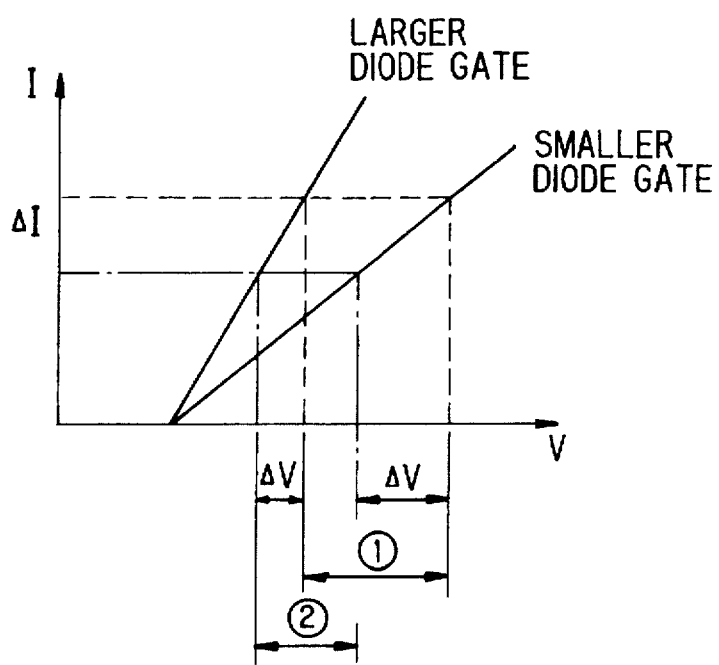
FIG. 13 is a current-voltage characteristic diagram regarding gate width of a diode.
Figure 14:
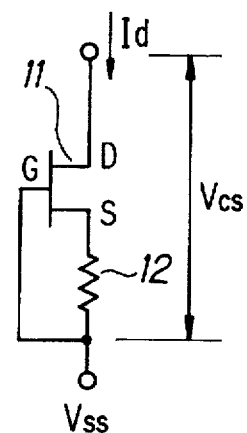
FIG. 14 is a diagram showing the construction of a first constant-current circuit using a FET according to the prior art.

When the absolute value of the power-supply voltage $V_{SS}$ (negative polarity) increases, the gate voltage of the FET 52b-2 increases and the drain current $I_2$' thereof increases. As a result, the current which flows through the diode 52b-3 decreases. When the current decreases, the voltage (voltage drop) across the terminals of the diode decreases. FIG. 13 shows the current-voltage characteristic of the diode. This characteristic varies depending upon the gate width of the diode. That is, for the same current change $\Delta I$, the smaller the gate width of the diode, the greater the width $\Delta V$ of the voltage change. Accordingly, if the gate width of the diode 52b-3 is made comparatively small, the gate-source voltage $V_{gs}$ of the FET 52a decreases with a decrease in the current flowing through the diode $D_2$ and, hence, the drain current $I_2$ of the FET diminishes. More specifically, if the gate width of the diode 52b-3 is made considerably smaller than the gate width of the diode 51b-2, a difference is produced with regard to the voltage drop $\Delta V$, as shown at ①, ② in FIG. 13. Accordingly, the gate-source voltage $V_{gs}$ decreases and so does the drain current $I_2$.

In a case where the absolute value of the power-supply voltage $V_{SS}$ decreases, operation is the opposite of the foregoing and drain current increases. As a result of the foregoing, the characteristic shown in FIG. 8B is obtained.

When the first and second constant-current sources having the foregoing characteristics are connected in parallel, the overall temperature characteristic becomes the combined temperature characteristics of the first and second constant-current sources 51, 52. The result is the characteristic shown in FIG. 9A. Further, the overall power-supply voltage characteristic becomes the combined power-supply voltage characteristics of the first and second constant-current sources 51, 52. The result is the characteristic shown in FIG. 9B. The characteristics of FIGS. 9A and 9B are the characteristics of a constant-current circuit necessary in order to render constant the optical power of a laser diode.

It should be noted that the resistors R1, R2 and R4, R5 may be replaced by variable resistors so as to make it possible to adjust the current value. Further, it is unnecessary for the gate widths, etc., of the FETs 51a, 52a to be made identical; it may be so arranged that the ratio of the gate widths in the FETs is changed in conformity with the required conditions.

Thus, in accordance with the present invention, the fluctuation in the voltage $V_{CS}$ applied to the constant-current circuit is detected and feedback control is performed so as to decrease/increase the gate bias voltage of the FET in dependence upon an increase/decrease in the fluctuation of voltage. Even if the voltage $V_{CS}$ fluctuates, therefore, the current $I_d$ can be held constant.

Further, in accordance with the present invention, the voltage-fluctuation detector and the bias-voltage controller can be constituted by FET elements. As a result, a simple arrangement can be used to render current constant even if the voltage $V_{CS}$ fluctuates.

Furthermore, in accordance with the present invention, a plurality of constant-current sources are provided and a constant-current circuit is constructed by connecting these constant-current sources in parallel. As a result, the overall desired power-supply voltage characteristic and temperature characteristic can be set for the constant-current circuit by adjusting the power-supply voltage characteristic and temperature characteristic of each individual constant-current source. For example, there are provided a first constant-current source having a biasing circuit for setting a power-supply voltage characteristic in which drain current increases in dependence upon an increase in power-supply voltage and a temperature characteristic in which drain current increases in dependence upon an increase in temperature, and a second constant-current source having a biasing circuit for setting a power-supply voltage characteristic in which drain current decreases in dependence upon an increase in power-supply voltage and a temperature characteristic in which drain current is rendered substantially constant even if temperature fluctuates. By connecting the first and second constant-current sources in parallel by interconnecting their drains and interconnecting their sources, a power-supply voltage characteristic in which drain current is rendered substantially constant even if power-supply voltage fluctuates and a temperature characteristic in which drain current increases in dependence upon an increase in temperature can be set. This constant-current circuit can be used as a constant-current source of a laser-diode drive circuit for driving a laser diode in such a manner that optical power is rendered constant.

As many apparently widely different embodiments of the present invention can be made without departing from the spirit and scope thereof, it is to be understood that the invention is not limited to the specific embodiments thereof except as defined in the appended claims.

What is claimed is:

1. A constant-current circuit, comprising:

a first constant-current source having a first field-effect transistor which has a source terminal, a drain terminal connected to a load circuit and a gate terminal, and a biasing circuit connected to a power supply for setting a power-supply voltage characteristic in which the drain current increases in dependence upon an increase in power-supply voltage and a temperature characteristic in which drain current increases in dependence upon an increase in temperature; and a second constant-current source having a second field-effect transistor which has a source terminal, a drain terminal connected to the load circuit and a gate terminal, and a biasing circuit connected to the power supply for setting a power-supply voltage characteristic in which drain current decreases in dependence upon an increase in power-supply voltage and a temperature characteristic in which drain current is rendered substantially constant even if temperature fluctuates;

wherein; said first and second constant-current sources are connected in parallel by interconnecting the drain terminals and interconnecting the source terminals of the first and second field-effect transistors in said first and second constant-current sources and said constant-current circuit has a power-supply voltage characteristic in which the drain current as an output current is rendered substantially constant even if power-supply voltage fluctuates, and a temperature characteristic in which the drain current increases in dependence upon an increase in temperature.

2. The constant-current circuit according to claim 1, wherein said load circuit includes:
   a differential amplifier constituted by third and fourth field-effect transistors in which source terminals of the third and fourth field-effect transistors are interconnected and further connected to the drain terminals of said first and second field-effect transistors, a data signal being input to a gate terminal of the third field-effect transistor and a reference voltage being input to a gate terminal of the fourth field-effect transistor;
   a laser diode disposed between the drain terminal of the fourth field-effect transistor and the power supply; and
   a diode disposed between the drain terminal of the third field-effect transistor and the power supply.

3. The constant-current circuit according to claim 1 and further comprising a first diode, which is connected between the source terminals of the first and second field-effect transistors and the power supply (Vss), having a negative characteristic with respect to a temperature rise; wherein the biasing circuit in said first constant-current source includes:
   a resistor voltage-dividing section for voltage-dividing the power-supply voltage and applying the divided voltage to a gate terminal of the first field-effect transistor constituting the first constant-current source,
and the biasing circuit of said second constant-current source includes:
   a bias voltage supply section for supplying a gate terminal of a second field-effect transistor constituting the second constant-current source with the bias voltage;
   a third field-effect transistor for controlling the bias voltage;
   a second diode, which is connected between the gate terminal of said second field-effect transistor and the power supply (Vss), having a negative characteristic with respect to a temperature rise; and
   a resistor voltage-dividing section for voltage-dividing the power-supply voltage and applying the divided voltage to a gate terminal of said third field-effect transistor.

* * * * *